United States Patent [19]
Uda et al.

[11] Patent Number: 5,477,184
[45] Date of Patent: Dec. 19, 1995

[54] FET SWITCHING CIRCUIT FOR SWITCHING BETWEEN A HIGH POWER TRANSMITTING SIGNAL AND A LOWER POWER RECEIVING SIGNAL

[75] Inventors: Hisanori Uda, Higashiosaka; Yasoo Harada, Hirakata, both of Japan

[73] Assignee: Sanyo Electric Co., Ltd., Moriguchi, Japan

[21] Appl. No.: 47,786

[22] Filed: Apr. 15, 1993

[30] Foreign Application Priority Data

Apr. 15, 1992 [JP] Japan .................................. 4-122604

[51] Int. Cl.⁶ .............................................. H03K 17/687
[52] U.S. Cl. ........................ 327/404; 379/61; 333/103
[58] Field of Search ......................... 379/61; 455/82, 455/83; 307/571, 602, 241, 242; 327/404, 403, 405, 408; 333/103, 104; 343/876, 858

[56] References Cited

U.S. PATENT DOCUMENTS

| | | | |
|---|---|---|---|
| 3,824,564 | 7/1974 | Wegener | 307/475 |
| 4,264,828 | 4/1981 | Perlegos et al. | 307/475 |
| 4,502,027 | 2/1985 | Ayasli | 307/241 |
| 4,719,374 | 1/1988 | Bialo | 307/242 |
| 4,810,911 | 3/1989 | Noguchi | 307/571 |
| 4,959,873 | 9/1990 | Flynn et al. | 307/571 |
| 4,993,061 | 2/1991 | Hsieh | 379/61 |
| 5,010,261 | 4/1991 | Steigerwald | 327/404 |
| 5,017,817 | 5/1991 | Yamakawa | 307/270 |
| 5,023,494 | 6/1991 | Tsukii et al. | 333/104 |
| 5,047,674 | 9/1991 | Clark et al. | 333/103 |
| 5,063,313 | 11/1991 | Kikuda et al. | 307/451 |
| 5,091,657 | 2/1992 | Burt | 307/571 |
| 5,159,297 | 10/1992 | Tateno | 333/104 |
| 5,341,033 | 8/1994 | Koker | 327/73 |

OTHER PUBLICATIONS

"DC–40 GHz and 20–40 GHz MMIC SPDT Switches" by Schindler et al, IEEE Transactions on Electron Devices, vol. ED–34, No. 12, Dec. 1987 pp. 2595–2602.

Primary Examiner—Timothy P. Callahan
Assistant Examiner—Terry L. Englund
Attorney, Agent, or Firm—Darby & Darby

[57] ABSTRACT

An FET switch used for switching between a first transmission path includes a plurality of FETs for the transmission of a low power signal received at an antenna and a second transmission path including a plurality of FETs for the transmission of a higher power signal to the antenna, wherein the first transmission path and the second transmission path have FET circuits of configurations different from each other and/or employ FETs of different characteristics.

11 Claims, 7 Drawing Sheets

FET SWITCHING CIRCUIT FOR SWITCHING BETWEEN A HIGH POWER TRANSMITTING SIGNAL AND A LOWER POWER RECEIVING SIGNAL

BACKGROUND OF THE INVENTION

1. Field of the Invention

The present invention relates to an FET switch used for switching between a plurality of transmission paths each having at least one FET (Field Effect Transistor).

2. Description of Related Art

In an antenna switch used in a digital cordless telephone or in a digital mobile telephone, both transmitting and receiving communication is carried out by means of a single antenna. An FET switch is used to select either one transmission path dedicated to the transmission of a relatively weak signal received by the antenna or another transmission path dedicated to the transmission of medium power (about 100 mW) to the antenna.

FIG. 1 is a drawing illustrative of a configuration of an FET switch of the prior art, wherein a first transmission path 61 has an FET 62 and an FET 63, and a second transmission path 71 has an FET 72 and an FET 73. The FET 62, FET 63, FET 72 and FET 73 are manufactured under the same process conditions. The FET 62 and FET 72 are identical FETs, and the FET 63 and FET 73 are identical FETs. Hence the first transmission path 61 and the second transmission path 71 have FET circuits of configurations symmetrical with each other.

FIG. 2 is a drawing illustrative of another configuration of an FET switch of the prior art, wherein a first transmission path 81 has an FET 82; an FET 83 and an FET 84, and a second transmission path 91 has an FET 92, an FET 93 and an FET 94. The FET 82, FET 83, FET 84, FET 92, FET 93 and FET 94 are manufactured under the same process conditions. The FET 82 and FET 92 are identical FETs, the FET 83 and FET 93 are identical FETs and the FET 84 and FET 94 are identical FETs. Hence the first transmission path 81 and the second transmission path 91 have FET circuits of configurations symmetrical with each other.

As described above, FET switches of the prior art have transmission paths made in symmetrical FET circuits and Further the FETs constituting each transmission path are manufactured under identical process conditions, For the purpose of universality.

In case a switching circuit is mated with another device such as amplifier, mixer, etc. operating in the microwave region, a switching circuit which matches the characteristics of the integrated circuits of the mating device is selected from switching circuits manufactured separately from the mating devices, and the selected switching circuit is combined with the mating device thereafter.

However, as the degree of circuit integration increases, the switching circuit is increasingly integrated with other devices such as amplifier and mixer into MMIC (Microwave Monolithic Integrated Circuit). This leads to such problems that the FET circuit has optimum performance for the characteristics of one transmission path but is not suitable for the characteristics of the other transmission path, or the FET circuit has somewhat acceptable performance for both transmission paths but are not satisfactory, if the FET circuit has a symmetrical configuration in both transmission paths and further identical FETs are used in both transmission paths, as in the case of the FET switch of the prior art.

SUMMARY OF THE INVENTION

One object of the invention is to provide an FET switch capable of giving each transmission path the best characteristics for the signals it transmits.

Another object of the invention is to provide an FET switch having good switching performance even when it is integrated with other devices such as amplifier and mixer.

The FET switch according to the invention selects one transmission path from a plurality of transmission paths each having FETs for the transmission of signals, wherein each transmission path has an FET circuit configuration different from other and/or each transmission path includes FETs manufactured under conditions different from each other.

In the FET switch of the invention, transmission paths are made asymmetrical by making the FET circuit of each transmission path in a configuration different from the other path and/or employing in each transmission path FETs of different characteristics from those of other transmission path. Therefore it becomes possible to make each transmission path have the best characteristics, and to install the FETs most suitable for each transmission path to match the mating device. The FET is also capable of working with excellent switching characteristics even when it is integrated with other devices such as an amplifier and a mixer.

The above and further objects and features of the invention will more fully be apparent from the following detailed description with accompanying drawings.

DESCRIPTION OF THE PREFERRED EMBODIMENTS

Preferred embodiments of the invention will be described below taking examples in the application of the invention to antenna switches for a portable telephone.

Embodiment 1

Figure 1:
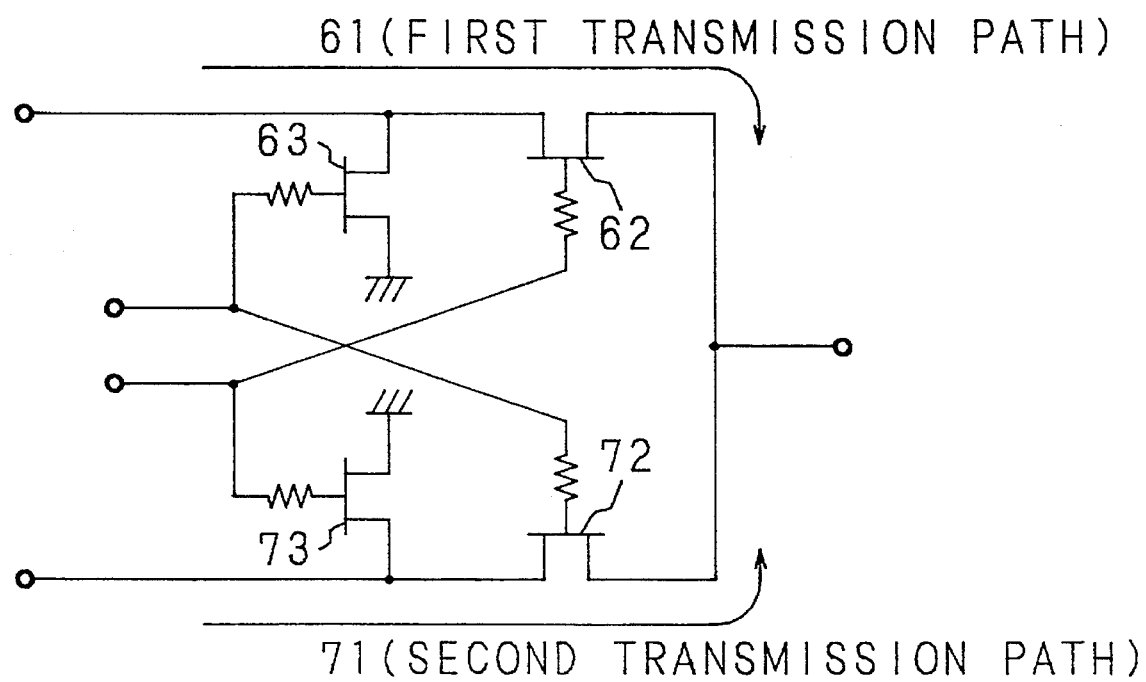
FIG. 1 is a drawing illustrative of the configuration of an FET switch of the prior art.
Figure 2:
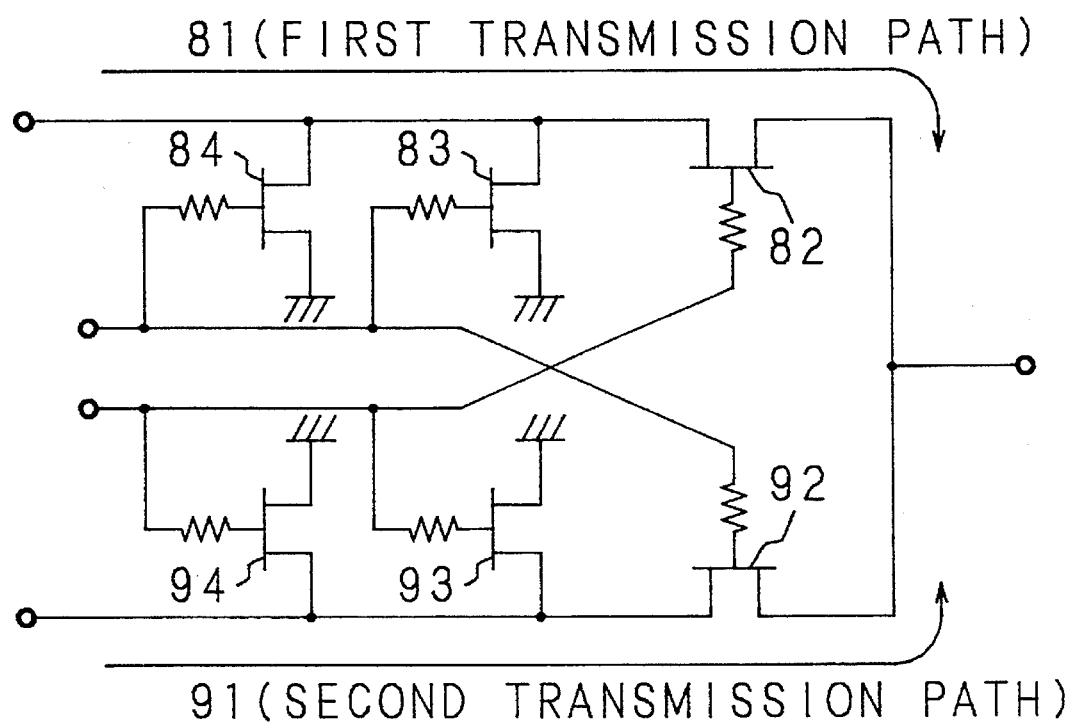
FIG. 2 is a drawing illustrative of the configuration of another FET switch of the prior art.
Figure 3:
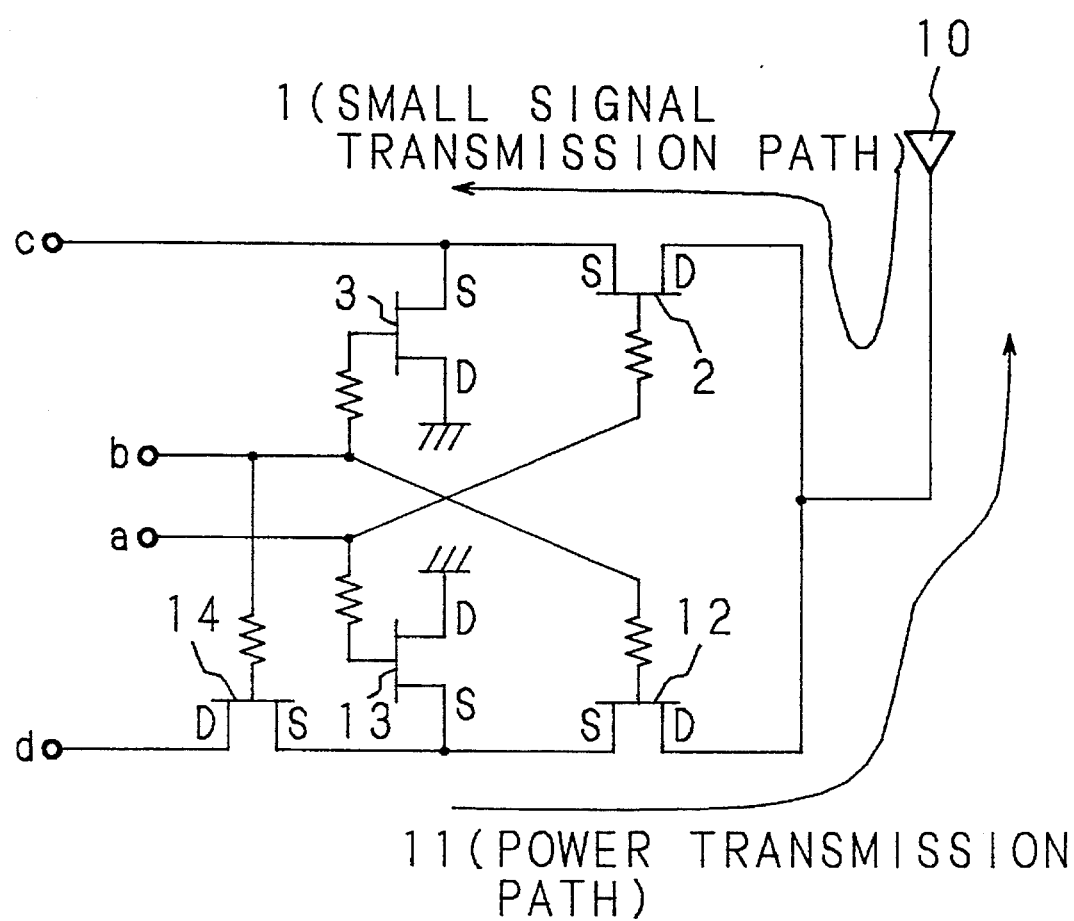
FIG. 3 is a drawing illustrative of the configuration of an FET switch of an embodiment of the invention.

FIG. 3 shows the configuration of an FET switch (antenna switch for a portable telephone) according to the invention. The FET switch has a signal transmission path 1 used in transmission of weak power received at an antenna 10 to a signal amplifier (not shown), and a path 11 used in the transmission of output (medium power level) from a power amplifier (not shown) to the antenna 10. The low power signal transmission path 1 has a FET 2 and an FET 3, and the higher power transmission path 11 has an FET 12, an FET 13 and an FET 14.

In the low power signal transmission path 1, drain (D) of FET 2 is connected to the antenna 10 and gate of FET 2 is connected to one gate terminal a. Gate of FET 3 is connected to another gate terminal b and drain (D) of FET 3 is grounded. Sources (S) of FET 2 and FET 3 are connected to a low power signal output terminal c which connects to a signal amplifier (not shown). In the higher power transmission path 11, drain (D) of FET 12 is connected to the antenna 10, drain (D) of FET 13 is grounded, and drain (D) of FET 14 is connected to a power input terminal d which connects to the power amplifier (not shown). Sources (S) of FET 12, FET 13 and FET 14 are connected to each other. Gate of FET 13 is connected to the gate terminal a, and gates of FET 12 and FET 14 are connected to the gate terminal b.

The FETs which constitute the FET switch are controlled to turn on and off by the gate voltage (Vg) applied to the gate terminals a and b. When voltage Vg=0 V is applied to the gate terminal a, voltage Vg=–3 V (or –5 V) is applied to the gate terminal b. When voltage Vg=–3 V (or –5 V) is applied to the gate terminal a, conversely, voltage Vg=0 V is applied to the gate terminal b. Application of a voltage Vg=0 V turns on each FET, and application of voltage Vg=–3 V (or –5 V) turns off each FET.

As shown in FIG. 3, the FET circuit in the low power signal transmission path 1 and the FET circuit in the higher power transmission path 11 have configurations asymmetrical with each other. The transmission paths 1 and 11 also employ FETs of different threshold voltages (Vth). For example, if an FET is on when its applied gate voltage is 0 V and off when its applied gate voltage is –5 V, threshold voltage Vth of the series FET 2 is –2.6 V and Vth of the branching FET 3 is –4.3 V in the low power signal transmission path 1, while Vth of the series FET 12 and FET 14 is –4.3 V and Vth of the branching FET 13 is –2.6 V in the higher power transmission path 11. Thus an FET having the same value of Vth as that of the series FET of the low power signal transmission path 1 is used for the branching FET of the power transmission path 11, and an FET having the same value of Vth as that of the series FET of the higher power transmission path 11 is employed for the branching FET of the low power signal transmission path 1. The reason of installing the two series FETs 12 and 14 in the higher power transmission path 11 is to prevent it from having nonlinear characteristic. The configurations of the FET circuits in the transmission paths 1 and 11, and the characteristics of FETs used in the transmission paths 1 and 11 are determined so that the transmission paths 1 and 11 have the best characteristics to match the signals to be transmitted.

Now the operation will be described below. When the antenna 10 receives a signal, which is of a relatively low power, Vg of 0 V is applied to the gate terminal a and Vg of –3 V (or –5 V) is applied to the gate terminal b. Then the FETs 2 and 13 are turned on and the FETs 3, 12 and 14 are turned off. As a result, the low signal received at the antenna 10 is directed to the small signal transmission path 1 and does not pass through the power transmission path 11. And the low power signal reaches the low power signal output terminal c because the FET 3 is off. The reason of turning the FET 13 on at this point is to prevent very weak signal leaking into the power transmission path 11 from reaching the power input terminal d by conducting it to the ground.

When sending output of medium power level to the antenna 10 for transmission, Vg of –3 V (or –5 V) is applied to the gate terminal a and Vg of 0 V is applied to the gate terminal b, so that the FETs 3, 12 and 14 are turned on and the FETs 2 and 13 are turned off. The higher power signal fed to the power input terminal d is supplied to the antenna 10 via the power transmission path 11 (FET 14, 12) without fail, because the FETs 2 and 13 are off. The reason of turning the FET 3 on at this point is to prevent a very weak power signal from leaking into the small signal transmission path 1 from reaching the low power signal output terminal c by conducting it to the ground.

It will be considered that installing FETs of different manufacturing conditions for different transmission paths may lead to an increase in the manufacturing processes. However, when integrating a low power signal amplifier and a higher power amplifier with an FET switch as shown in FIG. 3, the FET switch and other devices can be integrated without increasing the manufacturing processes by employing identical FETs for the FET of the low power signal amplifier and for the FET used in the low power signal transmission path 1 of the FET switch, and employing identical FETs for the FET of the higher power amplifier and for the FET used in the higher power transmission path 11 of the FET switch, thereby decreasing the probability of the problem as described above to become negligible.

In Embodiment 1, as described above, it is possible to give each of the transmission paths 1 and 11 the characteristics most suitable thereto, because the FET circuits are made in different configurations between the low power signal transmission path 1 and the higher power transmission path 11, and moreover FETs of different characteristics are employed.

Embodiment 2

Figure 4:
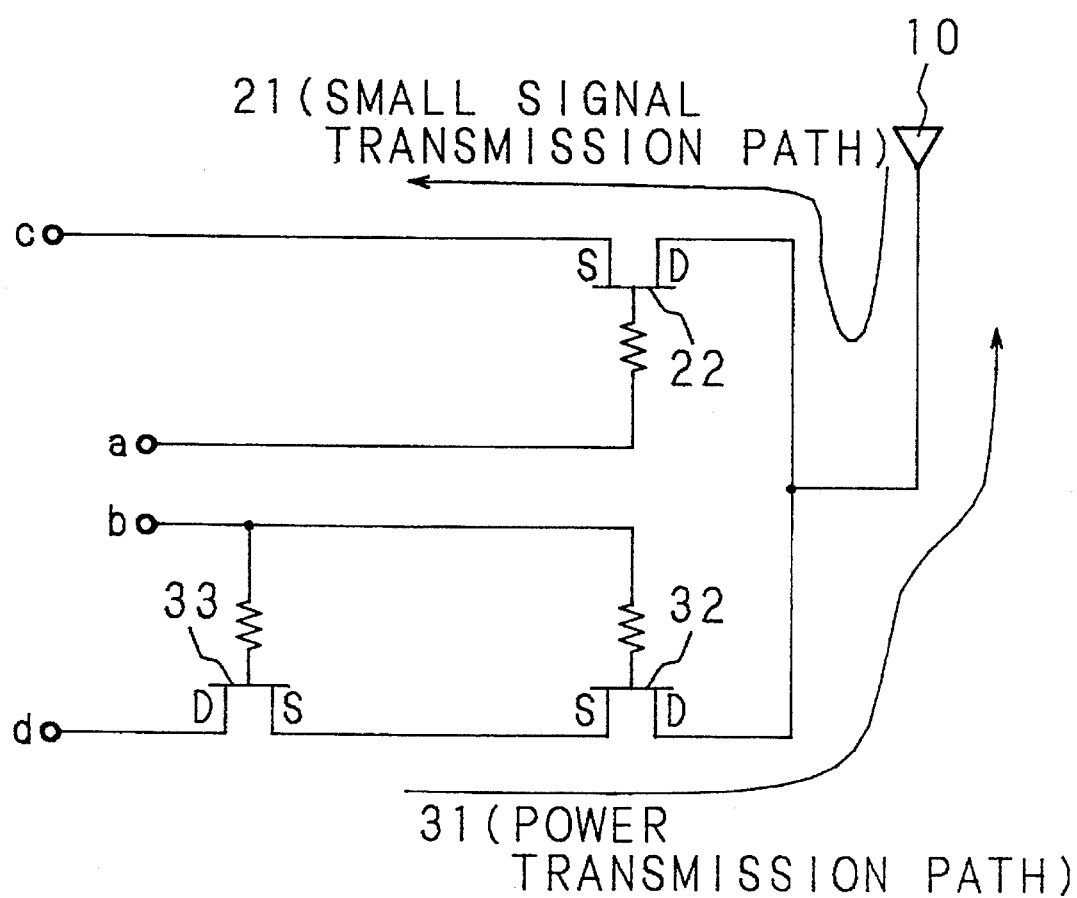
FIG. 4 is a drawing illustrative of the configuration of an FET switch of another embodiment of the invention.

FIG. 4 is a drawing illustrative of another configuration of the FET switch (antenna switch for portable telephone) according to the invention. The FET switch has a low power signal transmission path 21 used in transmission of a low power signal received at the antenna 10 to a a low power signal amplifier (not shown) via a low power signal output terminal c, and a higher power transmission path 31 used in the transmission of output from a power amplifier (not shown) to the antenna 10 via a power input terminal d, similarly to Embodiment 1 shown in FIG. 3. The low power signal transmission path 21 has an FET 22, and the higher power (transmission path 31 has an FET 32 and an FET 33. In Embodiment 2, as in the case of Embodiment 1, the low power signal transmission path 21 and the higher power transmission path 31 have FET circuits of different configurations and employ FETs of different characteristics, thereby making it possible to assign the best characteristics to each of the transmission paths 21 and 31. The operation in Embodiment 2 can be deduced from that in Embodiment 1 described above, and will not therefore be explained here.

Embodiment 3

Figure 5:
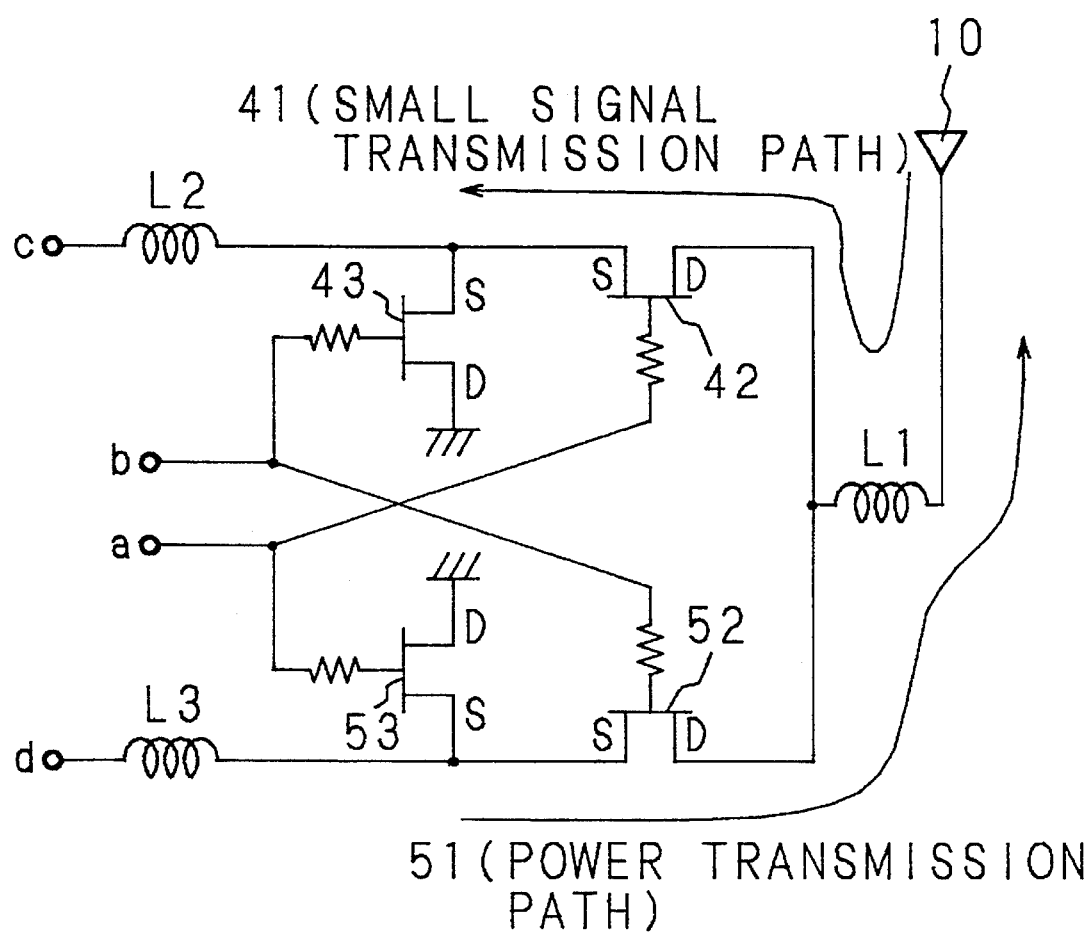
FIG. 5 is a drawing illustrative of the configuration of an FET switch of Further another embodiment of the invention.

FIG. 5 shows the configuration of the FET switch (antenna switch For portable telephone) according to the invention. In Embodiment 3, configurations of the FET circuits are the same among the transmission paths, although FETs having different characteristics are used in respective transmission paths. The FET switch has a low power signal transmission path 41 used in transmission of low power signals received at an antenna 10 as a signal to a low power signal amplifier (not shown), and a power transmission path 51 used in the transmission of output (max. 20 dBm) from a power amplifier (not shown) to the antenna 10. The low power signal transmission path 41 has an FET 42 and an FET 43, and the higher power transmission path 51 has an FET 52 and an FET 53.

In the low power signal transmission path 41, drain (D) of the FET 42 is connect to the antenna 10 via a coil L1, and gate of the FET 42 is connected to one gate terminal a. Gate of the FET 43 is connected to another gate terminal b and (drain (D) of the FET 43 is grounded. Sources (S) of the FET 42 and FET 43 are connected via a coil L2 to a low power signal output terminal c which connects to the low power signal amplifier. In the power transmission path 51, drain (D) of the FET 52 is connected to the antenna 10, and drain (D) of the FET 53 is grounded. Gate of the FET 52 is connected to the gate terminal b. Gate of the FET 53 is connected to the gate terminal a. Sources (S) of the FET 52 and FET 53 are connected via a coil L3 to a power input terminal d which connects to the power amplifier.

Switching voltages which are applied to the gate of each FET are 0 V when on and −3 V when off. Threshold voltage Vth of each FET is Vth=−0.8 V in the FET 42 and FET 53, and Vth=−2.4 V in the FET 43 and FET 52. Gate widths of the FETs are 1400 μm in the FET 42, 200 μm in the FET 43, 1000 μm in the FET 52, and 200 μm in the FET 53. Inductance components of the wire bonds of coils L1, L2 and L3 are about 0.8 nH.

Figure 6:
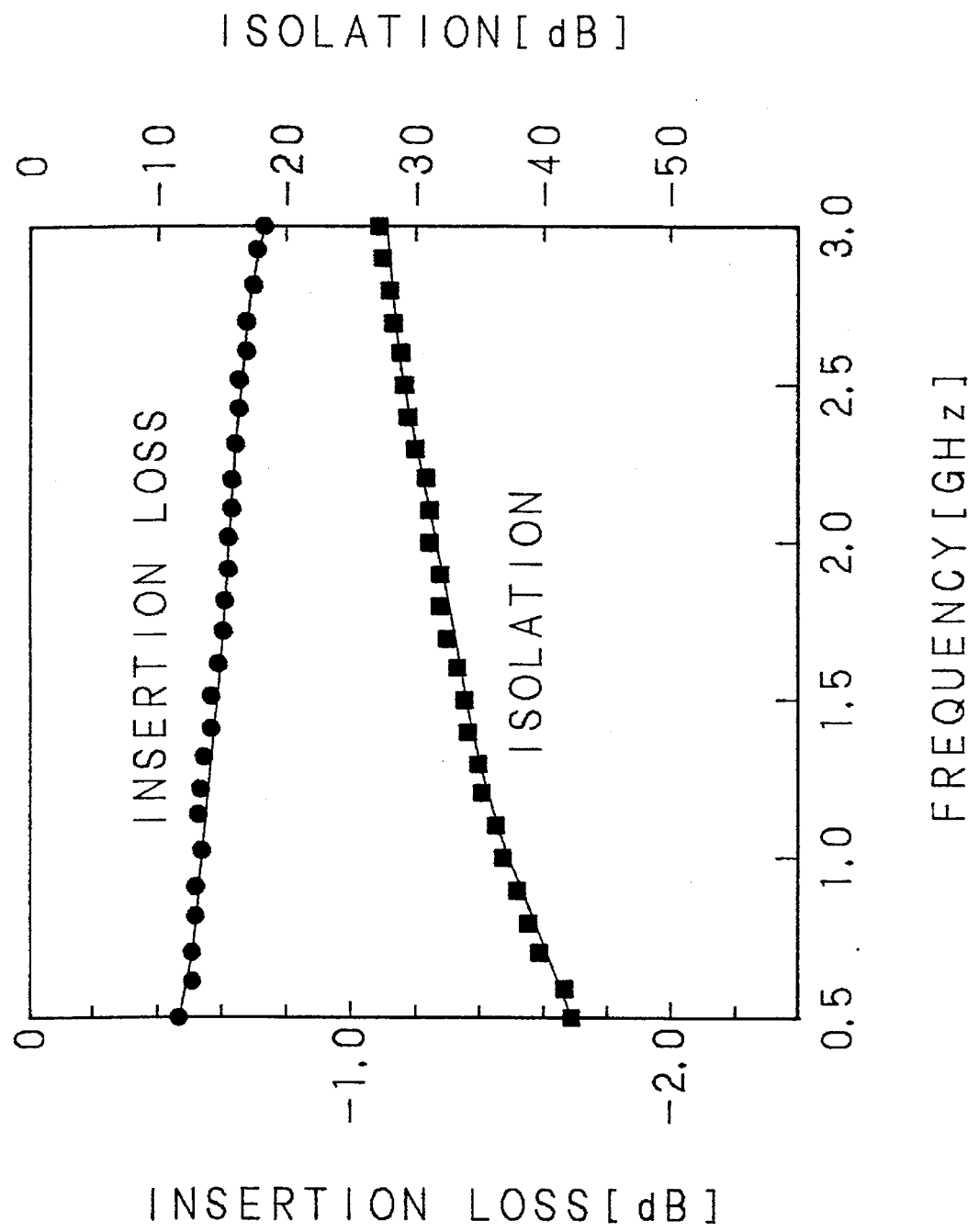
FIG. 6 is a graph showing the circuit characteristic of FIG. 5.
Figure 7:
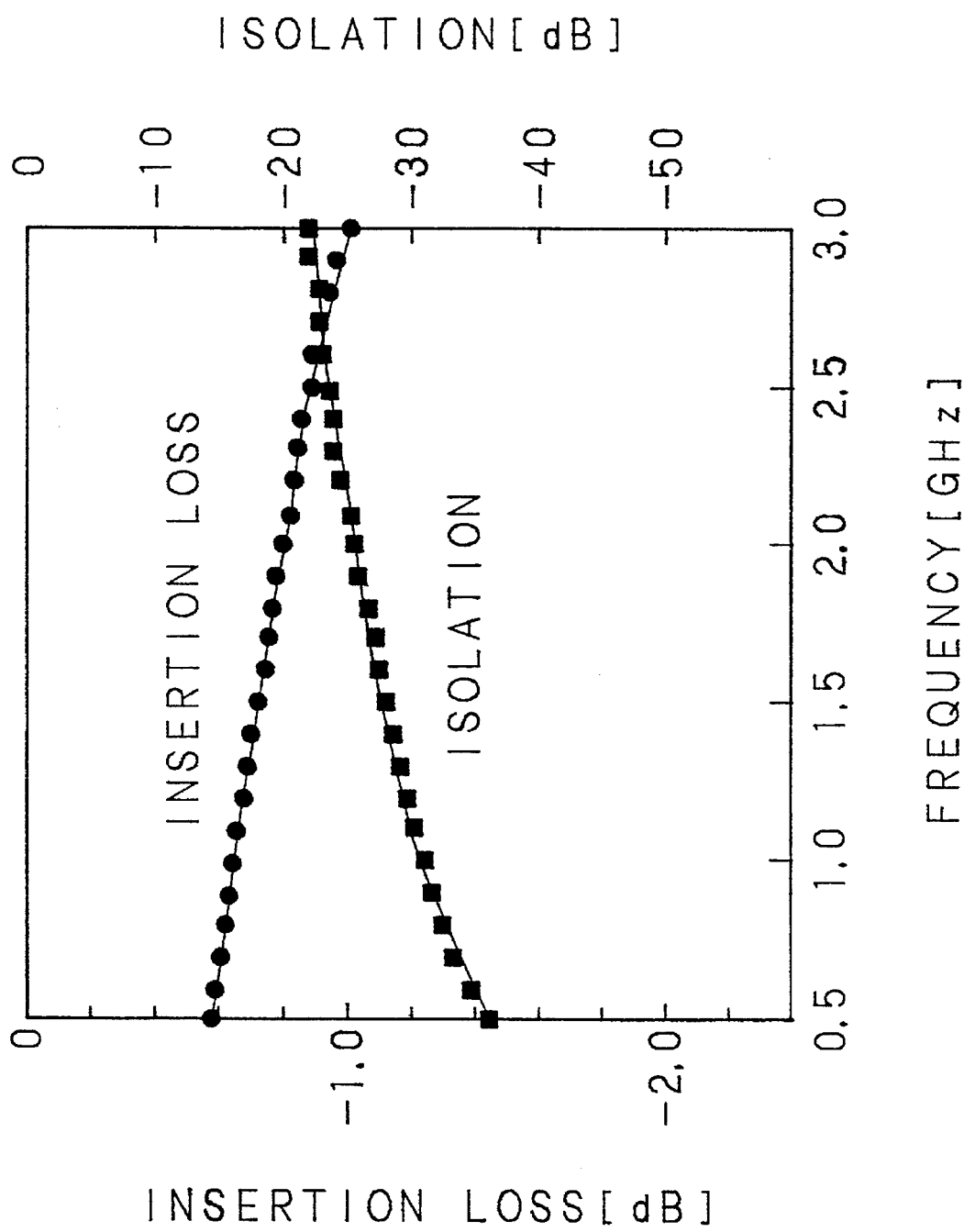
FIG. 7 is a graph showing the circuit characteristic of FIG. 5.

FIG. 6 and FIG. 7 show the circuit characteristics of the FET switch. FIG. 6 is a graph wherein insertion loss and isolation when the FETs 42 and 53 are on and FETs 43 and 52 are off, namely the low power signal transmission path 41 is on, are plotted as abscissa and frequency is plotted as ordinate. FIG. 7 is a graph wherein insertion loss and isolation when the FETs 43 and 52 are on and the FETs 42 and 53 are off, namely the power transmission path 51 is on, are plotted as abscissa and frequency is plotted as ordinate. At the operating frequency 1.9 GHz of the portable telephone, insertion loss is 0.55 dB and isolation is 31 dB when the low power signal transmission path 41 is on, and insertion loss is 0.65 dB and isolation is 24 dB when the higher power transmission path 51 is on. And P1 dB (1 dB compression) is 25.4 dBm, indicating an excellent performance.

Similar effects can be obtained if the source (S) and drain (D) in the embodiments described above are reversed.

Embodiment 4

An FET switch, wherein FETs having the same characteristics are used in respective transmission paths but configurations of the FET circuits in respective transmission paths are different from each other, is one example of the present invention. The construction and operation of such a example can be deduced from the above embodiments, and will not be described here.

As this invention may be embodied in several forms without departing from the spirit of essential characteristics thereof, the present embodiment is therefore illustrative and not restrictive, since the scope of the invention is defined by the appended claims rather than by the descriptions preceding them, and all changes that fall within metes and bounds of the claims, or equivalence of such metes and bounds thereof are therefore intended to be embraced by the claims.

What is claimed is:

1. An FET switch for microwave signals, comprising:
a first transmission path for receiving signals having at least one FET with a negative threshold voltage serially connected in said path and a second transmission path for transmitting signals of a higher power level than the received signals of said first transmission path having at least one FET with a negative threshold voltage serially connected in said path, said at least one serially connected FET of each path for switching signal transmission through the respective said first transmission path and said second transmission path, the negative threshold voltage of each of said at least one serially connected FET of said second transmission path having a greater negative value than the negative threshold voltage of each said at least one serially connected FET of said first transmission path.

2. An FET switch as in claim 1, wherein:
said first transmission path has at least one branching FET with a negative threshold voltage substantially equal to the negative threshold value of each said at least one serially connected FET of said second transmission path, and said second transmission path has at least one branching FET with a negative threshold voltage substantially equal to the negative threshold value of each said at least one serially connected FET of said first transmission path.

3. An FET switch as in claim 2, wherein each of said first and second transmission paths has a circuit configuration different from the other.

4. An FET switch as in claim 1 wherein said second transmission path has a plurality of serially connected FETs each having substantially the same negative threshold voltage.

5. An FET switch as in claim 4, wherein:
said first transmission path has one or more branching FET having a negative threshold voltage substantially equal to the negative threshold voltage of each of the plurality of serially connected FETs of said second transmission path, and said second transmission path has one or more branching FET(s) having a negative threshold voltage substantially equal to the negative threshold voltage of each said at least one serially connected FET of said first transmission path.

6. An FET switch as claimed in claim 5, wherein each of said first and second transmission paths has a circuit configuration different from the other.

7. An FET antenna switch for microwave signal, comprising:
a first transmission path for receiving signals received by the antenna having at least one FET with a negative threshold voltage serially connected in said path and a second transmission path for transmitting signals to the antenna of a higher power level than the received signals of said first transmission path and having at least one FET with a negative threshold value serially connected in said path, said at least one FET of each of said first and second transmission path for respectively switching signal transmission through said first transmission path for receiving and said second transmission path for transmitting, the negative threshold voltage of each said at least one serially connected FET of said second transmission path for transmitting being of a higher negative value than the negative threshold voltage of each said at least one serially connected FET of said first transmission path for receiving.

8. An FET switch as in claim 7, wherein said second transmission path for transmitting has at least one branching FET with a negative threshold voltage substantially equal to the negative threshold value of a said at least one serially connected FET of said first transmission path for receiving, and said first transmission path for receiving has at least one branching FET with a negative threshold voltage substantially equal to the negative threshold value of a said at least one serially connected FET of said second transmission path for transmitting.

9. An FET switch as in claim 7 wherein said second transmission path for transmitting has a plurality of serially connected FETs, the negative threshold voltage of each of the plurality of serially connected FETs of said second transmission path for transmitting being substantially the same.

10. An FET switch as in claim 9, wherein said second transmission path for transmitting has at least one branching FET with a negative threshold voltage substantially equal to the respective threshold voltage of the said at least one serially connected FET of said first transmission path for receiving, and said first transmission path for receiving has at least one branching FET with a negative threshold voltage substantially equal to the negative threshold voltage of one of the plurality of serially connected FETs of said second transmission path for transmitting.

11. An FET switch as claimed in claim 10, wherein each of said first and second transmission path means has a circuit configuration different from the other.

\* \* \* \* \*